United States Patent
Lu

(10) Patent No.: US 10,141,237 B2
(45) Date of Patent: Nov. 27, 2018

(54) FINGERPRINT RECOGNITION MODULE AND MANUFACTURING METHOD THEREFOR

(71) Applicant: Primax Electronics Ltd., Taipei (TW)

(72) Inventor: Tsung-Yi Lu, Taipei (TW)

(73) Assignee: PRIMAX ELECTRONICS LTD., Taipei (TW)

(*) Notice: Subject to any disclaimer, the term of this patent is extended or adjusted under 35 U.S.C. 154(b) by 0 days.

(21) Appl. No.: 15/677,163

(22) Filed: Aug. 15, 2017

(65) Prior Publication Data

US 2018/0138103 A1 May 17, 2018

Related U.S. Application Data

(60) Provisional application No. 62/422,484, filed on Nov. 15, 2016.

(51) Int. Cl.
| | | |
|---|---|---|
| H01L 23/31 | (2006.01) | |
| H01L 21/48 | (2006.01) | |
| H01L 21/78 | (2006.01) | |
| H01L 23/00 | (2006.01) | |
| H01L 23/492 | (2006.01) | |
| H01L 21/56 | (2006.01) | |
| H01L 23/498 | (2006.01) | |
| G06K 9/00 | (2006.01) | |

(52) U.S. Cl.
CPC ...... *H01L 23/3142* (2013.01); *H01L 21/4853* (2013.01); *H01L 21/4871* (2013.01); *H01L 21/565* (2013.01); *H01L 21/78* (2013.01); *H01L 23/492* (2013.01); *H01L 23/4985* (2013.01); *H01L 23/564* (2013.01); *G06K 9/00006* (2013.01); *G06K 9/00013* (2013.01)

(58) Field of Classification Search
CPC ............... H01L 23/3142; H01L 23/492; H01L 23/4985; H01L 23/564; H01L 21/4853; H01L 21/4871; H01L 21/565; H01L 21/78; G06K 9/00006
See application file for complete search history.

(56) References Cited

U.S. PATENT DOCUMENTS

| 6,936,495 B1 * | 8/2005 | Chiang | H01L 21/4821 257/E23.033 |
|---|---|---|---|
| 2016/0322283 A1 * | 11/2016 | McMahon | H01L 23/293 |
| 2018/0053030 A1 * | 2/2018 | Zhang | G06K 9/0002 |
| 2018/0053745 A1 * | 2/2018 | Cheng | H01L 25/0657 |

* cited by examiner

*Primary Examiner* — Cheung Lee
*Assistant Examiner* — Stephen C Smith
(74) *Attorney, Agent, or Firm* — Kirton McConkie; Evan R. Witt

(57) ABSTRACT

This application provides a fingerprint recognition module and a manufacturing method therefor. The fingerprint recognition module includes a flexible printed circuit (FPC) board, a die, an adhesive layer, and a cover plate. The manufacturing method includes the following steps: (a) directly welding the die to the FPC board, and electrically connecting the die to the FPC board; (b) coating the adhesive layer on an upper surface of the die; (c) covering the adhesive layer with a cover plate, to adhere the cover plate to the adhesive layer; and (d) applying low pressure injection modeling encapsulation to an encapsulation space defined between the cover plate and the FPC board, so as to form an encapsulation layer in the encapsulation space and produce a waterproof effect.

4 Claims, 5 Drawing Sheets

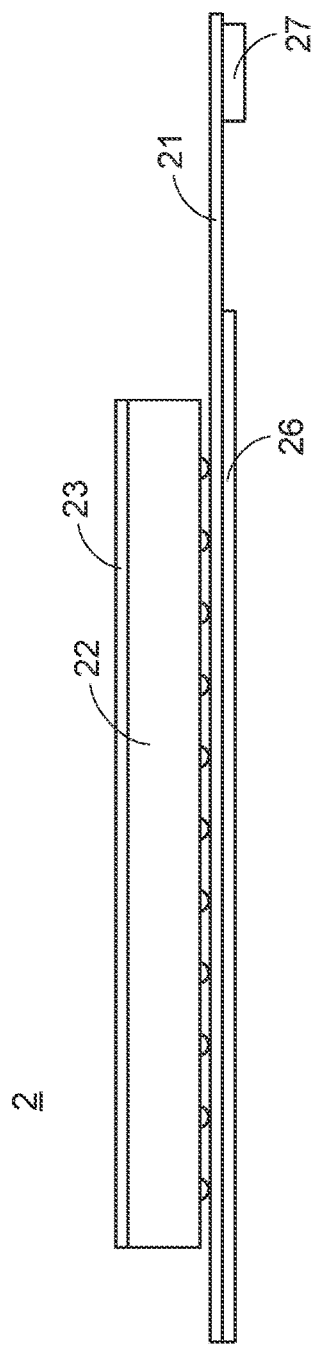
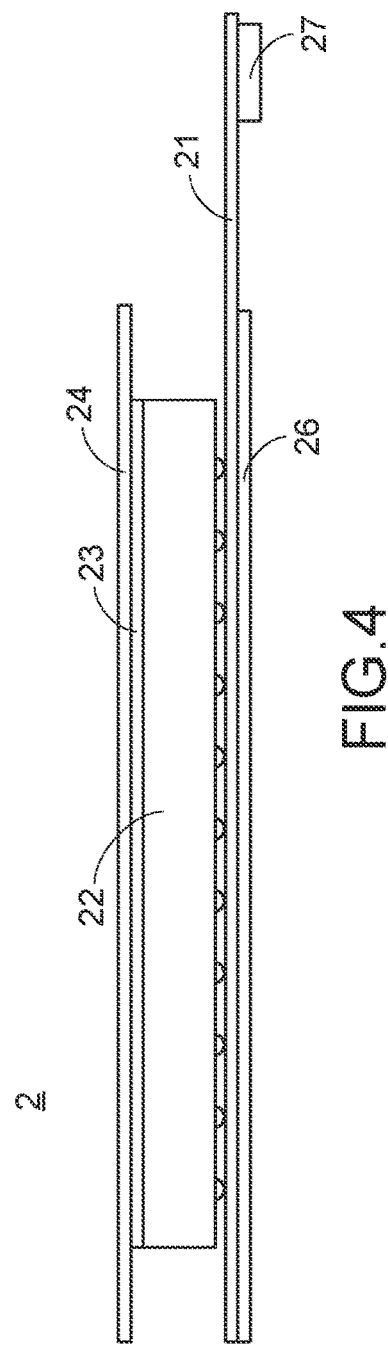

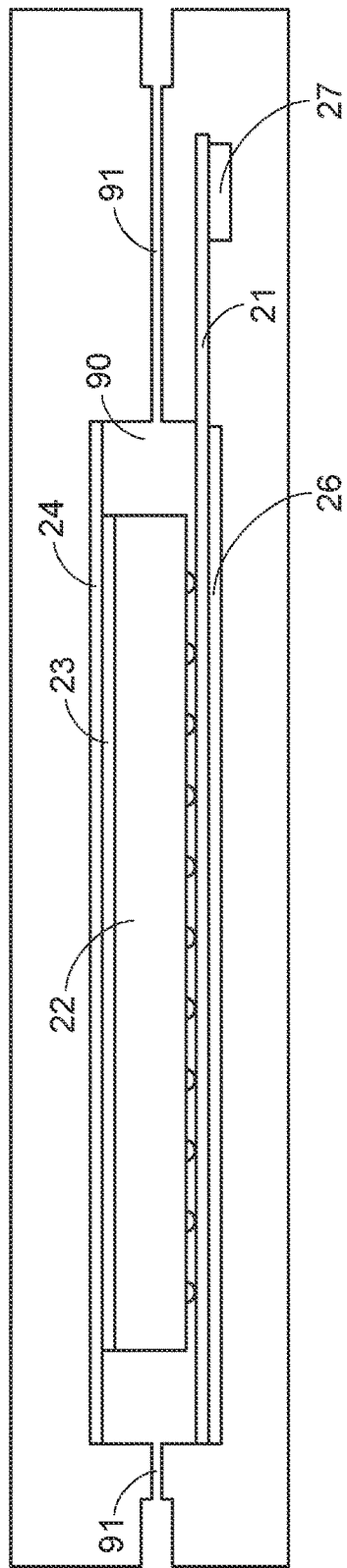
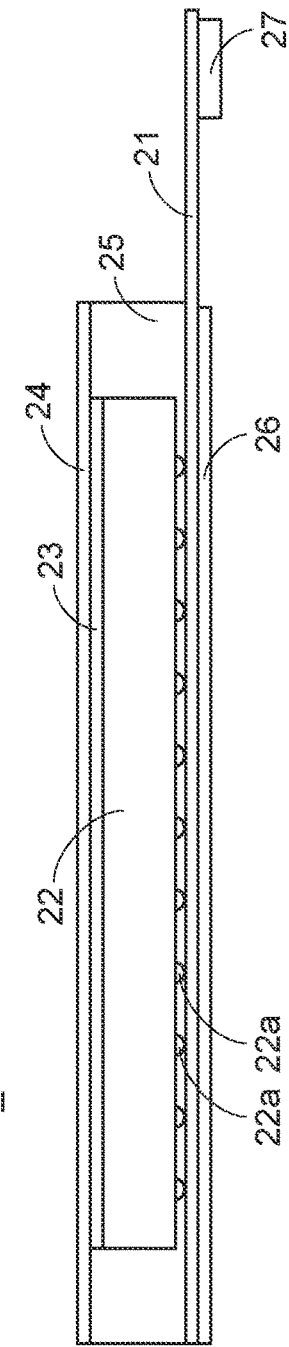
FIG.5
FIG.6

FINGERPRINT RECOGNITION MODULE AND MANUFACTURING METHOD THEREFOR

FIELD OF THE INVENTION

This application relates to a fingerprint recognition module and a manufacturing method therefore, and in particular, to a fingerprint recognition module in which a die is directly disposed on a flexible printed circuit (FPC) board, and a manufacturing method therefor.

BACKGROUND OF THE INVENTION

With rapid development of science and technologies, almost everyone is equipped with a mobile electronic apparatus or a notebook computer. To facilitate an identity of a user being securely recognized on a mobile electronic apparatus or a notebook computer, currently, a most popular approach of the biological recognition type is fingerprint recognition.

Referring to FIG. 1, FIG. 1 is a sectional view of a conventional fingerprint recognition module. A conventional fingerprint recognition module 1 includes an FPC board 11, solder paste 12, an integrated circuit (IC) substrate 13, and a die 14. A manufacturing manner for the conventional fingerprint recognition module 1 includes first fixing several dies 14 that are cut from a wafer to the IC substrate 13 in a dispensing manner, and then, performing wire-bonding to electrically connect a plurality of contacts on each die 14 to the IC substrate. After the wire-bonding is completed, an encapsulation process is subsequently performed, that is, the die 14 and a bonding wire on the IC substrate 13 are encapsulated. Afterward, cutting is performed to cut and separate the multiple encapsulated dies 14 together with the IC substrate by means of computerized numerical control (CNC) or laser, to form several ICs. To apply the ICs to various electronic apparatuses, the ICs need to be further fixed to the FPC board 11 by using a surface mount technology. For example, the ICs are adhered to the FPC board 11 by using the solder paste 12. Finally, the FPC board 11 and the IC are further sealed together, so as to produce a waterproof effect.

However, the foregoing conventional process has complex steps, and relevant devices are expensive. Consequently, encapsulation and manufacturing costs cannot be lowered. In view of this, a conventional fingerprint recognition module and a manufacturing method therefor still need to be improved.

SUMMARY OF THE INVENTION

A main objective of the present invention is to provide a fingerprint recognition module and a manufacturing method therefor. By directly disposing a die on an FPC board and directly performing encapsulation on the FPC board, process steps of an entire fingerprint recognition module are simplified, and manufacturing costs are lowered.

A preferred implementation concept of this application is to provide a manufacturing method for vacuum lamination of a fingerprint recognition module, including the following steps:

(a) directly connecting and fixing a die to an FPC board, and electrically connecting the die to the FPC board;

(b) coating an adhesive layer on an upper surface of the die;

(c) covering the adhesive layer with a cover plate, to adhere the cover plate to the adhesive layer; and (d) applying low pressure injection modeling encapsulation to an encapsulation space defined between the cover plate and the FPC board, so as to form an encapsulation layer in the encapsulation space.

In a preferred embodiment, step (d) further includes the following steps:

(d1) placing the FPC board, the die, the adhesive layer, and the cover plate together into a mold;

(d2) adjusting pressure of the mold into a range of 1.5 to 40 bars; and (d3) injecting a hot melt material into the mold to make the hot melt material flow into the encapsulation space and be cured in the encapsulation space to form the encapsulation layer, wherein the encapsulation layer seals the die.

In a preferred embodiment, step (d3) further includes the following step:

(d30) injecting the hot melt material into the encapsulation space from a lateral side of the die through a feeding port of the mold.

In a preferred embodiment, before step (a), the method further includes the following step:

(a0) cutting a wafer into a plurality of dies.

In a preferred embodiment, after step (d), the method further includes the following step:

(e) removing and taking out the FPC board, the die, the adhesive layer, the cover plate, and the encapsulation layer that have been fixedly connected and combined with each other from the mold.

A preferred implementation concept of this application is to provide a fingerprint recognition module, including:

an FPC board;

a die, disposed on the FPC board, and electrically connected to the FPC board;

an adhesive layer, coated on an upper surface of the die;

a cover plate, covering the adhesive layer; and an encapsulation layer, cured and formed between the FPC board and the cover plate, and sealing the die.

In a preferred embodiment, a hot melt material is selected as a material of the encapsulation layer.

In a preferred embodiment, an upper surface of the encapsulation layer abuts against the cover plate, a lower surface of the encapsulation layer abuts against the FPC board, and the encapsulation layer surrounds and seals the die.

In a preferred embodiment, the adhesive layer is a die attach film (DAF) or a hydrogel.

In a preferred embodiment, the fingerprint recognition module further includes a carrier board, where the carrier board is located below the FPC board to carry the FPC board.

BRIEF DESCRIPTION OF THE DRAWINGS

FIG. 3 is a sectional view of coating an adhesive layer of a fingerprint recognition module on an upper surface of a die according to this application;

FIG. 4 is a sectional view of covering an adhesive layer with a cover plate of a fingerprint recognition module according to this application;

FIG. 5 is a sectional view of placing a cover plate, an adhesive layer, a die, and an FPC board into a low pressure injection modeling mold according to this application;

FIG. 6 is a sectional view of a fingerprint recognition module after completing low pressure injection modeling encapsulation according to this application.

DETAILED DESCRIPTION OF THE PREFERRED EMBODIMENT

Figure 1:
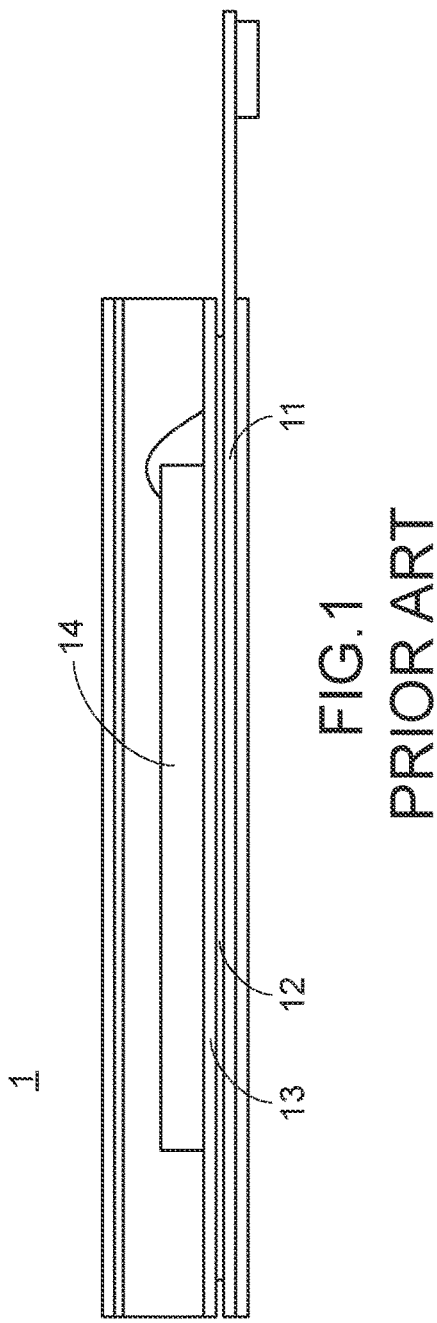
FIG. 1 is a sectional view of a conventional fingerprint recognition module.

Referring to FIG. 6, FIG. 6 is a sectional view of a fingerprint recognition module after completing low pressure injection modeling encapsulation according to this application, that is, a finished product of the fingerprint recognition module of this application. A fingerprint recognition module 2 of this application includes an FPC board 21, a die 22, an adhesive layer 23, a cover plate 24, and an encapsulation layer 25. It should be first noted that an FPC board is usually briefly referred to as a flexible board, on which after processing processes, such as etching, are performed, a plurality of needed circuits is finally reserved (not shown in the figure) as an electronic signal transmission medium. The die 22 of this application is a process of a through-silicon via (TSV). The die 22 is disposed on a circuit of an FPC board in a direct contact manner, so as to electrically connect the die 22 and the flexible circuit board 21 to each other.

Further, to dispose the cover plate 24 above the die 22, an adhesive layer 23 is disposed between the die 22 and the cover plate 24. That is, an adhesive layer 23 is coated on an upper surface of the die 22, so as to cover the adhesive layer 23 with the cover plate 24 and adhere the cover plate 24 to the adhesive layer 23. In a preferred implementation aspect, the adhesive layer 23 is a DAF or a hydrogel, but is not limited thereto.

The encapsulation layer 25 of the fingerprint recognition module of this application is cured and formed between the FPC board 21 and the cover plate 24 and seals the die 22. An upper surface of the encapsulation layer 25 abuts against the cover plate 24, a lower surface of the encapsulation layer 25 abuts against the FPC board 21, and the encapsulation layer 25 surrounds and seals the die 22. In this way, a periphery of the die 22 is completely sealed to prevent external moisture or dust from eroding metal contacts of the die 22, so as to reinforce a binding property of the entire fingerprint recognition module 2 and improve reliability of the entire fingerprint recognition module 2. In a preferred implementation aspect, a hot melt material is selected as a material of the encapsulation layer 25, and a property of the hot melt material is that the hot melt material is a solid body at a room temperature, and is melted into a fluid adhesive when being heated to a particular temperature.

The fingerprint recognition module 2 of this application further includes a carrier board 26. The carrier board 26 is located below the FPC board 21 to carry the FPC board 21, so as to improve structural strength of the entire fingerprint recognition module 2. In a preferred implementation aspect, the carrier board 26 is a structure-reinforced steel sheet. In addition, the fingerprint recognition module 2 of this application further includes a connector 27. The FPC board 21 may perform data transmission to the outside and obtain power from the outside via the connector 27.

Figure 2:
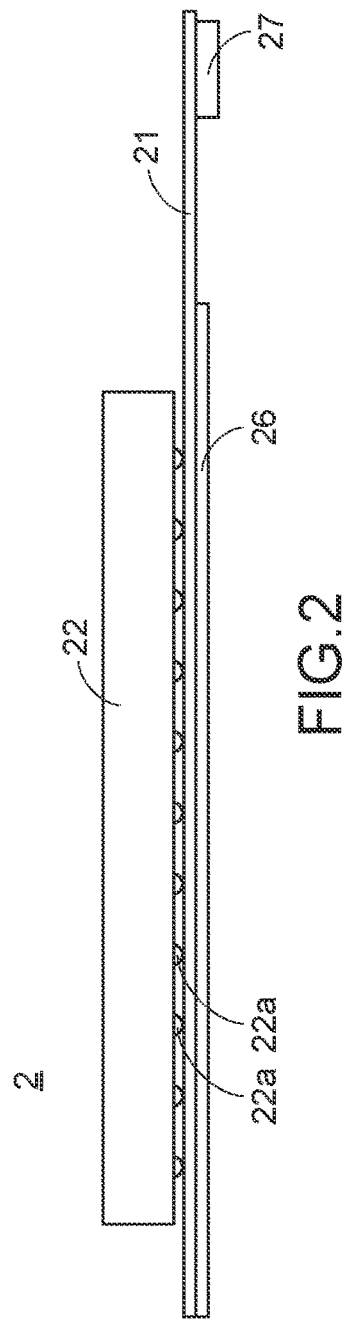
FIG. 2 is a sectional view of fixing a die of a fingerprint recognition module to an FPC board according to this application.
Figure 7A:
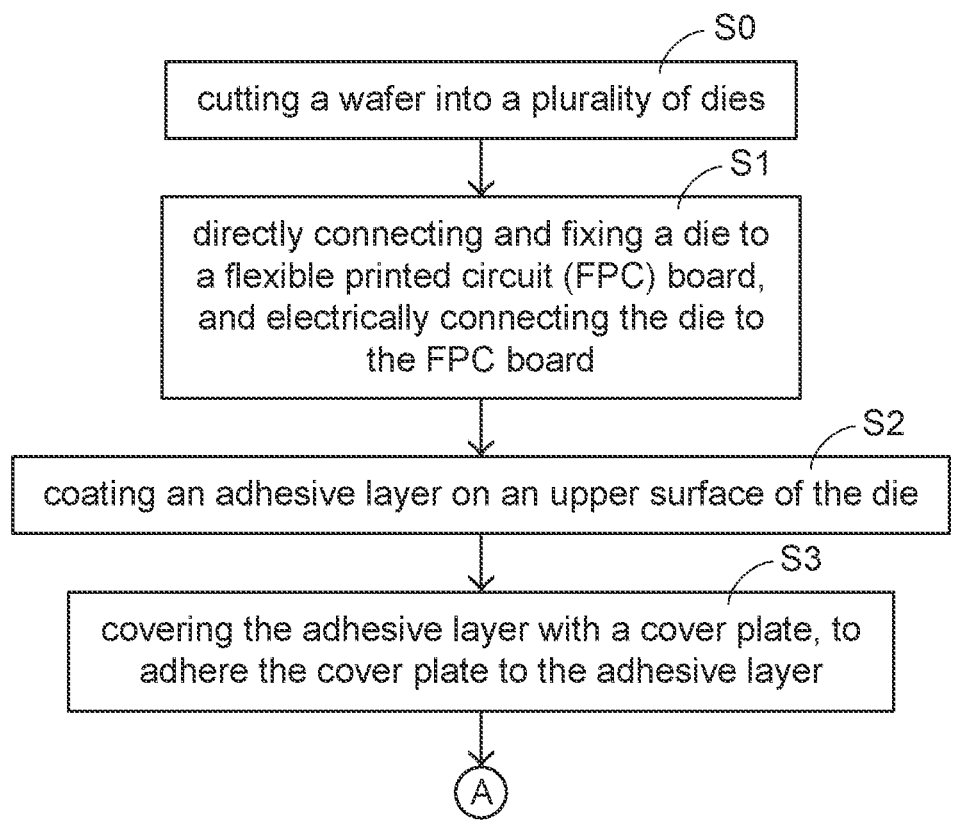
FIGS. 7A and 7B are a flowchart of a manufacturing method for a fingerprint recognition module according to this application.
Figure 7B:
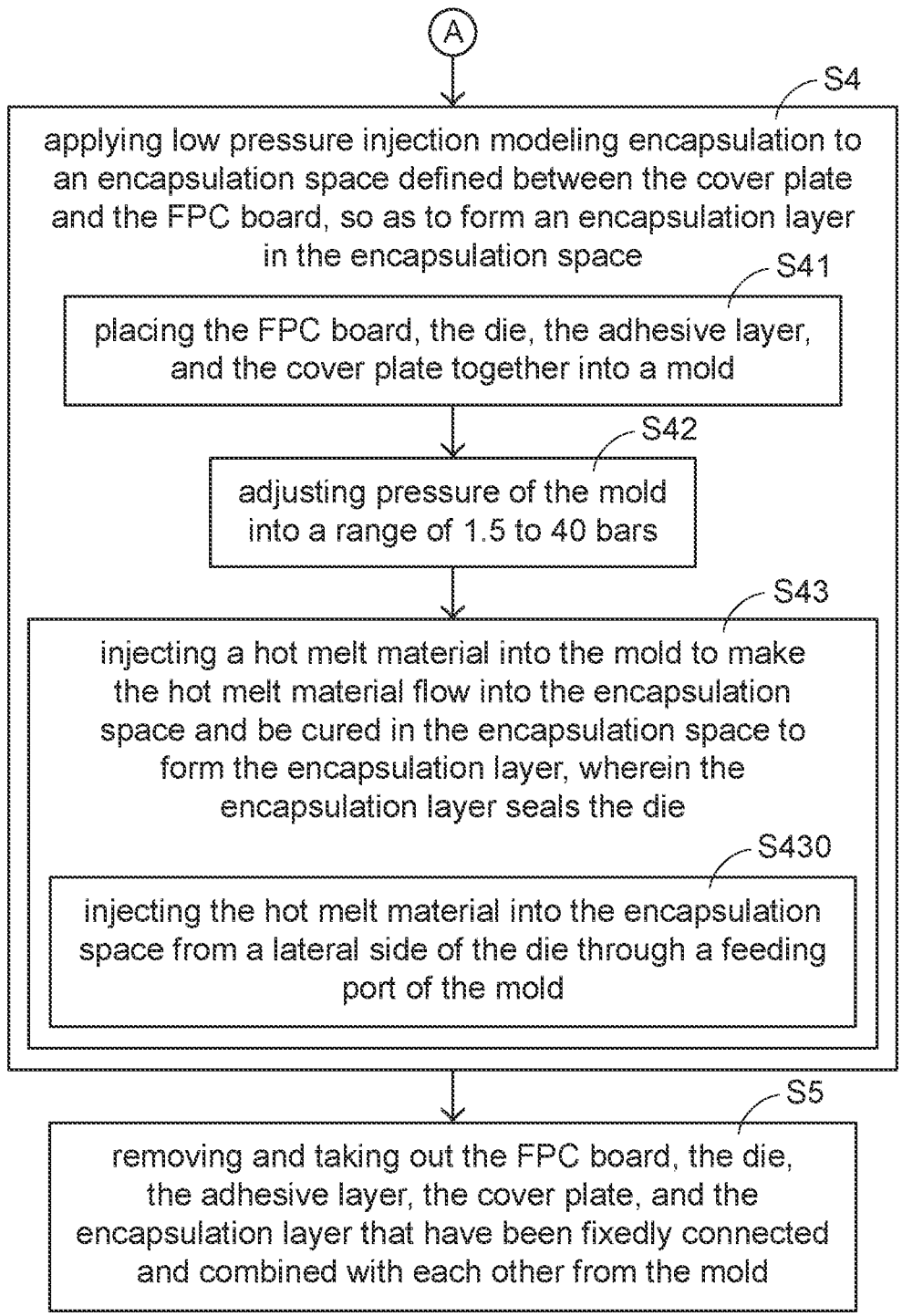

Referring to FIGS. 7A and 7B, FIGS. 7A and 7B are a flowchart of a manufacturing method for a fingerprint recognition module according to this application. In a manufacturing method for a fingerprint recognition module 2 of this application, as shown in FIG. 2, step S1 is performed first: Directly connect and fix a die 22 to an FPC board 21, and electrically connect the die 22 to the FPC board 21. The die 22 has a plurality of metal contacts 22a, and the die 22 is electrically connected to the FPC board 21 through the plurality of metal contacts 22a. In this application, the die 22 is fixed to an FPC board 21 in a welding manner. Preferably, a carrier board 26 is disposed below the FPC board 21, and the FPC board 21 is carried by the carrier board 26, so as to improve overall structural strength of the fingerprint recognition module of this application.

After step S1, step S2 is performed. In step S2, as shown in FIG. 3, an adhesive layer 23 is coated on an upper surface of the die 22. Subsequently, step S3 is performed. As shown in FIG. 4, the adhesive layer 23 is covered with a cover plate 24, so as to adhere the cover plate 24 to the adhesive layer 23. By means of step S2 and step S3, the cover plate 24 can be combined with the die 22 and be located above the die 22. In a preferred implementation aspect, the so-called cover plate 24 in this application may be made of a ceramic or glass material.

Subsequently, step S4 is performed. In step S4, as shown in FIG. 5, low pressure injection modeling encapsulation is performed on an encapsulation space 90 between the cover plate 24 and the FPC board 21, so as to form an encapsulation layer 25 in the encapsulation space 90. One advantage of the low pressure injection modeling encapsulation is that, compared with conventional high pressure modeling, use of the low pressure injection modeling encapsulation results in higher smoothness. It should be particularly noted herein that the encapsulation space 90 is defined between a lower surface of the cover plate 24 and an upper surface of the FPC board 21.

Specifically, the low pressure injection modeling process applied to this application is an open-mold process, and is an encapsulation process of injecting a hot melt material into a mold 9 at a low injection pressure to rapidly curing and modeling the hot melt material, so as to produce effects such as a waterproof effect, a dustproof effect, and a shock resistance effect. Step S4 further includes the following steps S41 to S43. Step S41: Place the FPC board 21, the die 22, the adhesive layer 23, and the cover plate 24 together into a mold 9, to prepare for encapsulation inside the mold 9. Step S42: Adjust pressure of the mold 9 into a range of 1.5 to 40 bars. The pressure range is merely a preferred example for describing a low pressure range in this application, and can be adjusted according to an actual environment and requirements. Step S43: Inject a hot melt material into the mold 9, to make the hot melt material flow into the encapsulation space 90 and be cured in the encapsulation space 90 to form encapsulation layer 25, where the encapsulation layer 25 seals the die 22. Step S43 further includes step S430: Inject the hot melt material into the encapsulation space 90 from a lateral side of the die 22 through a feeding port 91 of the mold 9.

After step (d), the method further includes step (e). In step (e), as shown in FIG. 6, the FPC board 21, the die 22, the adhesive layer 23, the cover plate 24, and the encapsulation layer 25 that have been fixedly connected and combined with each other are removed and taken out from the mold 9, to form a complete finished product of the fingerprint recognition module 2.

Besides, before step (a), the method further includes step (a0): cutting a wafer into a plurality of dies 22. The so-called die 22 of this application is a finished product cut from a TSV wafer.

Based on the above, in the fingerprint recognition module of this application, after being directly combined with the FPC board, the die is encapsulated on the FPC board. In this way, a conventional manufacturing procedure in which the die needs to be first combined with an IC substrate is omitted, and meanwhile, encapsulation and manufacturing costs are lowered. In addition, the fingerprint recognition module of this application is encapsulated by means of low pressure injection modeling, so that a requirement on encapsulation smoothness can certainly be satisfied.

The foregoing embodiments merely illustratively describe the principles and effects of the present invention and explain technical features of the present invention instead of limiting the protection scope of the present invention. All the changes or equivalent arrangements that can be easily completed by persons skilled in the art without departing from the technical principles and spirit of the present invention fall within the scope claimed by the present invention. Therefore, the protection scopes of the present invention are listed as the following claims.

What is claimed is:

1. A manufacturing method for a fingerprint recognition module, comprising the following steps:
   (a) directly connecting and fixing a die to a flexible printed circuit (FPC) board, and electrically connecting the die to the FPC board;
   (b) coating an adhesive layer on an upper surface of the die;
   (c) covering the adhesive layer with a cover plate, to adhere the cover plate to the adhesive layer; and
   (d) applying low pressure injection modeling encapsulation to an encapsulation space defined between the cover plate and the FPC board, so as to form an encapsulation layer in the encapsulation space, wherein step (d) further comprises the following steps:
      (d1) placing the FPC board, the die, the adhesive layer, and the cover plate together into a mold;
      (d2) adjusting pressure of the mold into a range of 1.5 to 40 bars; and
      (d3) injecting a hot melt material into the mold to make the hot melt material flow into the encapsulation space and be cured in the encapsulation space to form the encapsulation layer, wherein the encapsulation layer seals the die.

2. The manufacturing method for a fingerprint recognition module according to claim 1, wherein step (d3) further comprises the following step:
   (d30) injecting the hot melt material into the encapsulation space from a lateral side of the die through a feeding port of the mold.

3. The manufacturing method for a fingerprint recognition module according to claim 1, wherein before step (a), the method further comprises the following step:
   (a0) cutting a wafer into a plurality of dies.

4. The manufacturing method for a fingerprint recognition module according to claim 1, wherein after step (d), the method further comprises the following step:
   (e) removing and taking out the FPC board, the die, the adhesive layer, the cover plate, and the encapsulation layer that have been fixedly connected and combined with each other from the mold.

* * * * *